United States Patent
Tomonari et al.

(10) Patent No.: US 7,828,872 B2
(45) Date of Patent: Nov. 9, 2010

(54) COPPER MICROPARTICLE AND PROCESS FOR PRODUCING THE SAME

(75) Inventors: Masanori Tomonari, Yokkaichi (JP); Masatoshi Honma, Yokkaichi (JP); Yoshiyuki Kunifusa, Yokkaichi (JP)

(73) Assignee: Ishihara Sangyo Kaisha, Ltd., Osaka (JP)

( * ) Notice: Subject to any disclaimer, the term of this patent is extended or adjusted under 35 U.S.C. 154(b) by 785 days.

(21) Appl. No.: 11/660,102

(22) PCT Filed: Aug. 18, 2005

(86) PCT No.: PCT/JP2005/015087

§ 371 (c)(1), (2), (4) Date: Feb. 13, 2007

(87) PCT Pub. No.: WO2006/019144

PCT Pub. Date: Feb. 23, 2006

(65) Prior Publication Data

US 2008/0148904 A1  Jun. 26, 2008

(30) Foreign Application Priority Data

Aug. 20, 2004  (JP) .............................. 2004-241540
Aug. 20, 2004  (JP) .............................. 2004-241541

(51) Int. Cl.
*B22F 9/20*  (2006.01)

(52) U.S. Cl. ......................................... 75/343; 75/373

(58) Field of Classification Search .................. 75/252, 75/373, 343, 369, 710
See application file for complete search history.

(56) References Cited

U.S. PATENT DOCUMENTS

| 2,734,821 | A | * | 2/1956 | Schaufelberger | ............ | 75/371 |
|---|---|---|---|---|---|---|
| 3,033,703 | A | * | 5/1962 | Schneble, Jr. et al. | ....... | 427/305 |
| 3,046,159 | A | * | 7/1962 | Brookshire | .................. | 427/437 |
| 4,048,226 | A | * | 9/1977 | Barber et al. | ............... | 564/127 |
| 4,325,990 | A | * | 4/1982 | Ferrier | ........................ | 427/305 |
| 4,595,773 | A | * | 6/1986 | White | ........................ | 556/110 |
| 5,801,318 | A | * | 9/1998 | Tani et al. | ..................... | 75/373 |
| 5,850,047 | A | * | 12/1998 | Tani et al. | ..................... | 75/246 |
| 6,645,444 | B2 | * | 11/2003 | Goldstein | ....................... | 423/1 |

FOREIGN PATENT DOCUMENTS

| JP | 61-55562 B2 | | 11/1986 |
|---|---|---|---|
| JP | 01290706 | * | 11/1989 |
| JP | 2-34708 A | | 2/1990 |
| JP | 2638271 | | 4/1992 |
| JP | 4-235205 A | | 8/1992 |
| JP | 9-241709 A | | 9/1997 |
| JP | 2004-256857 A | | 9/2004 |
| JP | 2004-315853 A | | 11/2004 |
| WO | WO 02/13999 A1 | | 2/2002 |

* cited by examiner

*Primary Examiner*—Roy King
*Assistant Examiner*—Ngoclan T Mai
(74) *Attorney, Agent, or Firm*—Paul E. White, Jr.; Manelli Denison & Selter, PLLC (57) ABSTRACT

There is provided a process comprising mixing a divalent copper oxide with a reducing agent in the presence of a complexing agent and a protective colloid in a liquid medium to thereby produce copper microparticles without formation of a univalent copper oxide from the divalent copper oxide. Further, there is provided a process comprising reducing a divalent copper oxide in the presence of a complexing agent and a protective colloid, such as a protein, to thereby form metallic copper microparticles, adding a protective colloid scavenger, such as a protease, to thereby remove the protective colloid and effect agglomeration of metallic copper microparticles, and filtering the mixture by means of a pressure filter, a vacuum filter, a suction filter, etc.

12 Claims, 7 Drawing Sheets

FIG. 1

EXAMPLE 1

FIG. 2

EXAMPLE 2

EXAMPLE 19

FIG. 8

COMPARATIVE EXAMPLE 1

COPPER MICROPARTICLE AND PROCESS FOR PRODUCING THE SAME

This application is the national phase of international application PCT/JP2005/015087 filed 18 Aug. 2005 which designated the U.S.

TECHNICAL FIELD

The present invention relates to copper microparticles and a process for producing the same, and particularly to copper microparticles suitable for production of electrodes of laminated ceramics capacitors, circuits of printed-wiring boards, etc. and a process for producing the copper microparticles.

BACKGROUND ART

Metallic copper microparticles are inexpensive materials having good electric conductivity and are widely used as materials for ensuring electric conduction, such as circuit forming materials for printed-wiring boards, various electrical contact materials, outer electrode materials of capacitors, etc., and, recently, they are used also for inner electrodes of laminated ceramics capacitors. The laminated ceramics capacitors can give a larger capacity as compared with capacitors of other types, such as electrolytic capacitors and film capacitors, and are superior in mountability and high in safety and stability, and thus they have spread rapidly. With recent miniaturization of electronic equipments, the laminated ceramics capacitors are also being miniaturized. However, for maintaining large capacity, it is necessary to miniaturize them without reducing the number of lamination of ceramics sheet, and there is a limit in thinning of the sheet from the point of strength. Therefore, the miniaturization of laminated ceramics capacitors is realized by thinning the inner electrodes using fine metallic copper particles.

In order to use metallic copper microparticles as materials for ensuring electric conduction, usually copper microparticles are dispersed in a solvent or mixed with a binder such as epoxy resin thereby to prepare a paste, paint or ink, namely, a fluid composition such as a copper paste, paint or ink. For example, in forming a circuit of a printed-wiring board, the fluid composition is coated on a substrate in the pattern of circuit or electrode by means of screen printing, ink jet printing, or the like, and then heated to fusion bond the metallic copper microparticles, thereby forming fine electrodes. Furthermore, for formation of an inner electrode of laminated ceramics capacitors, the fluid composition is coated on thin ceramics sheets, and these sheets are laminated and then fired by heating to form inner electrodes.

As a process for producing metallic copper microparticles, there is known a process of reducing copper oxide with a hydrazine reducing agent in an aqueous liquid medium containing a protective colloid such as gum arabic (Patent Document 1), and in an example of this process, there are obtained copper microparticles having an average particle diameter in the range of 0.4-32 µm as measured by an electron microscope. There is further known a process which comprises precipitating copper hydroxide from an aqueous solution of a copper salt, adding a reducing sugar to the resulting copper hydroxide to reduce it to copper suboxide (cuprous oxide), and then reducing the cuprous oxide to metallic copper with a hydrazine reducing agent (Patent Document. 2). This document discloses that when a complexing agent such as Rochelle salt, amino acid, ammonia or an ammonium compound is added to the aqueous solution of copper salt, copper ion can be stably dissolved, and hence the addition of complexing agent is effective. In an example of this process, copper microparticles having a particle size distribution of 0.5±0.1 µm to 3.1±0.3 µm are obtained. Another process is known according to which in the process of Patent Document 2, gelatin as a protective colloid is added to the aqueous solution of copper salt and is further added during subsequent growth of nucleus particles of metallic copper (Patent Document 3). In an example of this process, there are obtained copper microparticles having a particle size distribution of 0.90±0.05 µm to 5.14±0.25 µm as measured by microtrack (dynamic light scattering method).

| | |
|---|---|
| Patent Document 1: | JP 61-55562 B2 |
| Patent Document 2: | Japanese Patent 2638271 |
| Patent Document 3: | JP 4-235205 A |

DISCLOSURE OF INVENTION

Problem to be Solved by the Invention

According to the conventional processes, although fine metallic copper particles can be obtained, primary particles of metallic copper are produced not in a monodispersed state, but in conspicuously agglomerated state, and, besides, secondary particles are in the form of particle lump and are uneven in size and shape. Therefore, they are not sufficient in dispersibility in the fluid composition, and when circuits, electrodes, etc. are formed, filling of them is inferior and defects are apt to occur. Thus, it is difficult to form thin inner electrodes of capacitors or fine circuits of printed-wiring boards. Accordingly, copper microparticles are demanded which contain substantially no agglomerated particles, and are regular in shape and excellent in dispersibility in spite of being fine metallic copper microparticles.

Furthermore, there is the following problem. That is, if a protective colloid is used as a dispersion stabilizer in producing metallic copper microparticles, the protective colloid attaches or adsorbs to the surface of the copper microparticles, and they can be obtained in monodispersed state without causing agglomeration of the copper microparticles. However, the copper microparticles produced are highly dispersed due to the presence of the protective colloid, and, hence, even if a flocculating agent is added, it is difficult to subject the copper microparticles to solid-liquid separation from a liquid medium in which anion and cation resulting from additives such as pH adjustor are present in a large amount in addition to the starting copper compound, residue of the reducing agent and the protective colloid, and thus an ultrafiltration that is unsuitable for mass-production must be carried out.

Means for Solving the Problem

As a result of intensive research conducted by the inventors on the starting material of copper compound and additives such as protective colloid in an attempt to solve the above problems, it has been found that if metallic copper microparticles are produced by using a monovalent copper oxide as a starting copper compound, or produced through two stage reactions of producing a monovalent copper oxide by reducing a divalent copper oxide and then re-reducing the monovalent copper oxide as in Patent Documents 2 and 3, the monovalent copper oxide is highly susceptible to reduction and the reduction reaction proceeds very rapidly; control of the reaction rate is difficult even when a complexing agent which forms a complex with copper oxide and controls the rate of reaction with reducing agent; therefore crystallites of metallic copper are produced in the reaction mixture in uneven distribution of concentration and hence particle growth also becomes uneven, and as a result, the shape of copper microparticles becomes irregular and production of agglomerated particles cannot be inhibited; and besides the production of agglomerated particles cannot be inhibited even if there is present a protective colloid which controls agglomeration of copper microparticles by attaching or adsorbing to the surface of the copper microparticles produced. It has further been found that a divalent copper oxide is lower in reduction rate than a monovalent copper oxide, and when a complexing agent is added to the reaction mixture, a small amount of crystallites of metallic copper are produced and uniform particle growth proceeds in accordance with progress of reduction reaction with the crystallites acting as nuclei, and, furthermore, when a protective colloid is added, there are obtained fine copper microparticles which are in the monodispersed state containing substantially no agglomerated particles, and are regular in shape of particles. Thus, the present invention has been accomplished.

Moreover, the inventors have found that copper microparticles can be flocculated when metallic copper microparticles are produced in the presence of a protective colloid and then a protective colloid scavenger is added to the reaction mixture, and the copper microparticles can be filtered off even by a usual means. Thus, the present invention has been accomplished.

That is, the present invention includes (1) a process for producing copper microparticles which comprises mixing a divalent copper oxide with a reducing agent in a liquid medium in the presence of a complexing agent and a protective colloid to thereby produce metallic copper microparticles and (2) a process for producing copper microparticles which comprises mixing a divalent copper oxide with a reducing agent in a liquid medium in the presence of a complexing agent and a protective colloid without including a step of producing a monovalent copper oxide from a divalent copper oxide.

The present invention further includes (3) a process for producing copper microparticles which comprises producing metallic copper microparticles in the presence of a completing agent and a protective colloid according to the above (1) or (2), thereafter adding a protective colloid scavenger to the liquid medium to flocculate the metallic copper microparticles, and then fractionating the metallic copper microparticles.

The present invention further includes (4) copper microparticles obtainable by the above processes and having an average particle diameter (D) of 0.005-2.0 μm as measured by an electron microscope, an average particle diameter (d) of 0.005-2.0 μm as measured by dynamic light scattering method, and a ratio d/D of 0.7-2. Moreover, the present invention includes (5) copper microparticles having an average particle diameter (D) of 0.005-0.5 μm as measured by an electron microscope, an average particle diameter (d) of 0.005-0.5 μm as measured by dynamic light scattering method, and a ratio d/D of 0.7-1.5.

Furthermore, the present invention includes (6) a fluid composition containing at least the copper microparticles of the above (4) and (5) and a dispersion medium.

ADVANTAGES OF THE INVENTION

The copper microparticles obtained by the process of the present invention are fine, contain substantially no agglomerated particles, and are regular in particle shape and excellent in dispersibility. The copper microparticles are useful as electrode materials of electronic equipments, etc., and when a fluid composition containing the copper microparticles is used for inner electrodes of laminated ceramics capacitors, circuits of printed-wiring boards, and other electrodes, there are obtained thin and high-density electrodes, and the like.

Furthermore, when a protective colloid scavenger is used, less leakage occurs in filtration, yield of the copper microparticles increases, and filtering and washing time can be shortened.

BEST MODE FOR CARRYING OUT THE INVENTION

The present invention relates to a process for producing copper microparticles which comprises mixing a divalent copper oxide with a reducing agent in a liquid medium in the presence of a complexing agent and a protective colloid to reduce the copper oxide thereby producing metallic copper microparticles. In the present invention, it is important to use a divalent copper oxide as a starting material, and a monovalent copper oxide such as copper suboxide (cuprous oxide) is not used. Further, it is preferred to produce metallic microparticles through a reaction of one stage by carrying out reduction under the conditions where a monovalent copper oxide is not produced from a divalent copper oxide. The term "divalent copper oxide" in the present invention means a copper oxide in which valence of copper is divalent ($Cu^{2+}$), and includes cupric oxide, cupric hydroxide and mixtures thereof. The divalent copper oxide may properly contain impurities such as other metals, metal compounds and non-metallic compounds, but preferably contains substantially no monovalent copper oxide, except for in an unavoidable amount. Furthermore, the divalent copper oxide preferably has an X-ray diffraction peak belonging to cupric oxide and more preferably has an average crystallite diameter in the range of 20-500 nm, more preferably 50-200 nm calculated from X-ray diffraction peak at plane (110) of cupric oxide using the following formula 1. When the average crystallite diameter of the divalent copper oxide is at least within the above range, desired metallic copper microparticles can be produced. If it is less than the above range, particle diameter is small and crystallinity is low, and hence dissolution rate of cupric oxide increases and it becomes difficult to control the reduction reaction rate unless a large amount of the complexing agent is used. On the other hand, if it is more than the above range, particle diameter is large and crystallinity is good, and hence dissolution rate decreases, and unreacted cupric oxide is apt to remain in the copper microparticles unless the reduction reaction time is prolonged. Thus, the larger average crystallite diameter is also not preferred. The process for producing the divalent copper oxide is not limited, and there may be used those which are industrially produced, for example, by electrolytic method, chemical conversion method, heat oxidization method, thermal decomposition method, indirect wet method, or the like.

$$D_{HKL} = K \cdot \lambda / \beta \cos \theta \qquad \text{Formula 1}$$

| | |
|---|---|
| $D_{HKL}$: | Average crystallite diameter (Å) |
| λ: | Wavelength of X-ray |
| β: | Half width of diffraction peak |
| θ: | Bragg's angle |
| K: | Constant (=0.9) |

In the present invention, the sequence of addition of respective materials is not limited in mixing of a divalent copper oxide and a reducing agent so long as a complexing agent and a protective colloid are present, and there may be employed, for example, (1) a method of adding the divalent copper oxide and the reducing agent simultaneously and in parallel with each other to a liquid medium containing the complexing agent and the protective colloid, (2) a method of adding the reducing agent to a liquid medium containing the complexing agent, protective colloid and divalent copper oxide, (3) a method of adding the complexing agent and the reducing agent simultaneously and in parallel with each other to a liquid medium containing the protective colloid and the divalent copper oxide, (4) a method of adding a mixture of the complexing agent and the reducing agent to a liquid medium containing the protective colloid and the divalent copper oxide, etc. The methods (3) and (4) are preferred because the reaction can easily be controlled, and the method (4) is particularly preferred. The divalent copper oxide, reducing agent, complexing agent and protective colloid may be previously suspended or dissolved in a liquid medium before using them for reduction reaction. The term "adding simultaneously and in parallel with each other" means to add the divalent copper oxide and the reducing agent or the complexing agent and the reducing agent separately from each other and at the same time in the reaction period, and includes addition of both of them continuously during the reaction period and besides addition of one or both of them intermittently.

As the liquid medium, for example, an aqueous liquid medium or an organic solvent liquid medium such as alcohol, preferably an aqueous liquid medium is used. The reaction temperature is preferably in the range of 10° C. to the boiling point of the liquid medium used because the reaction proceeds easily, more preferably in the range of 40-95° C. because fine metallic copper microparticles are obtained, further preferably in the range of 60-95° C., especially preferably in the range of 80-95° C. It is preferred to previously adjust the pH of the reaction solution to a range of 3-12 with an acid or alkali because settling of divalent copper oxide can be inhibited and uniform reaction can be performed. The reaction time can be set by controlling with addition time of the materials such as reducing agent, and is suitably, for example, about 10 minutes to 6 hours.

The "complexing agent" used in the present invention is considered to act in the course of the copper ion dissolving out of the divalent copper oxide or the divalent copper oxide being reduced to produce metallic copper, and is a compound capable of forming a copper complex compound by the bonding of a donor atom of ligand with copper ion or metallic copper, and the donor atom includes, for example, nitrogen, oxygen, sulfur or the like.

(1) Examples of complexing agents in which nitrogen is a donor atom are (a) amines (e.g., primary amines such as butylamine, ethylamine, propylamine and ethylenediamine, secondary amines such as dibutylamine, diethylamine and dipropylamine, and imines, e.g., piperidine and pyrrolidine, tertiary amines such as tributylamine, triethylamine and tripropylamine, and amines having two or more primary to tertiary amines in one molecule, such as diethylenetriamine and triethylenetetramine), (b) nitrogen-containing heterocyclic compounds (e.g., imidazole, pyridine and bipyridine), (c) nitriles (e.g., acetonitrile and benzonitrile) and cyano compounds, (d) ammonium and ammonium compounds (e.g., ammonium chloride and ammonium sulfate), (e) oximes, and the like.

(2) Examples of complexing agents in which oxygen is a donor atom are (a) carboxylic acids (e.g., oxycarboxylic acids such as citric acid, malic acid, tartaric acid and lactic acid, monocarboxylic acids such as acetic acid and formic acid, dicarboxylic acids such as oxalic acid and malonic acid, aromatic carboxylic acids such as benzoic acid), (b) ketones (e.g., monoketones such as acetone and diketones such as acetylacetone and benzoylacetone), (c) aldehydes, (d) alcohols (e.g., monohydric alcohols, glycols and glycerins, (e) quinones, (f) ethers, (g) phosphoric acids (orthophosphoric acid) and phosphoric acid compounds (e.g., hexametaphosphoric acid, pyrophosphoric acid, phosphorous acid and hypophosphorous acid), (h) sulfonic acid or sulfonic acid compounds, and the like.

(3) Examples of complexing agents in which sulfur is a donor atom are (a) aliphatic thiols (e.g., methyl mercaptan, ethyl mercaptan, propyl mercaptan, isopropyl mercaptan, n-butyl mercaptan, allyl mercaptan and dimethyl mercaptan), (b) alicyclic thiols (e.g., cyclohexylthiol), (c) aromatic thiols (e.g., thiophenol), (d) thioketones, (e) thioethers, (f) polythiols, (g) thiocarbonic acids (e.g., trithiocarbonic acids), (h) sulfur-containing heterocyclic compounds (e.g., dithiol, thiophene and thiopyran), (i) thiocyanates and isothiocyanates, (j) inorganic sulfur compounds (e.g., sodium sulfide, potassium sulfide and hydrogen sulfide), and the like.

(4) Examples of complexing agents having two or more kinds of donor atoms are (a) amino acids (having nitrogen and oxygen as donor atoms: e.g., neutral amino acids such as glycine and alanine, basic amino acids such as histidine and alginine, acidic amino acids such as aspartic acid and glutamic acid), (b) aminopolycarboxylic acids (having nitrogen and oxygen as donor atoms: e.g., ethylenediaminetetraacetic acid (EDTA), nitrilotriacetic acid (NTA), iminodiacetic acid (IDA), ethylenediaminediacetic acid (EDDA) and ethylene glycol diethyl ether diaminetetraacetic acid (GEDA), (c) alkanolamines (having nitrogen and oxygen as donor atoms: e.g., ethanolamine, diethanolamine and triethanolamine), (d) nitroso compounds and nitrosyl compounds (having nitrogen and oxygen as donor atoms), (e) mercaptocarboxylic acids (having sulfur and oxygen as donor atoms: e.g., mercaptopropionic acid, mercaptoacetic acid, thiodipropionic acid, mercaptosuccinic acid, dimercaptosuccinic acid, thioacetic acid and thiodiglycolic acid), (f) thioglycols (having sulfur and oxygen as donor atoms: e.g., mercaptoethanol and thiodiethylene glycol), (g) thionic acids (having sulfur and oxygen as donor atoms), (h) thiocarbonic acids (having sulfur and oxygen as donor atoms: e.g., monothiocarbonic acid, dithiocarbonic acid and thioncarbonic acid), (i) aminothiols (having sulfur and nitrogen as donor atoms: e.g., aminoethylmercaptan and thiodiethylamine), (j) thioamides (having sulfur and nitrogen as donor atoms: e.g., thioformamide), (k) thioureas (having sulfur and nitrogen as donor atoms), (l) thiazoles (having sulfur and nitrogen as donor atoms: e.g., thiazole and benzothiazole), (m) sulfur-containing amino acids (having sulfur, nitrogen and oxygen as donor atoms: e.g., cystine and methionine), and the like.

(5) Examples of salts or derivatives of the above compounds are alkali metal salts such as sodium citrate, sodium potassium tartrate, sodium hypophosphite and disodium ethylenediaminetetraacetate, and esters of carboxylic acids, phosphoric acids, sulfonic acid, and the like.

At least one of these complexing agents can be used. The amount of the complexing agents used can be optionally set, and 0.01-200 parts by weight for 1000 parts by weight of the divalent copper oxide is preferred because the effects of the present invention can be easily obtained. When the amount of the complexing agent is reduced within the above range, primary particles of the copper microparticles can be made smaller, and when it is increased within the above range, primary particles can be made larger. The amount is more preferably in the range of 0.1-200 parts by weight and further preferably in the range of 0.5-150 parts by weight.

In the present invention, complexing agents containing at least one atom selected from nitrogen and oxygen as a donor atom are preferred since the effect of the present invention can be easily obtained. Specifically, more preferred is at least one compound selected from amines, nitrogen-containing heterocyclic compounds, nitrites and cyano compounds, carboxylic acids, ketones, phosphoric acids and phosphoric acid-based compounds, amino acids, aminopolycarboxylic acids, alkanolamines, and salts or derivatives thereof. Oxycarboxylic acids are preferred among the carboxylic acids, diketones are preferred among the ketones, and basic and acidic amino acids are preferred among the amino acids. Furthermore, the complexing agent is preferably at least one compound selected from butylamine, ethylamine, propylamine, dibutylamine, diethylamine, dipropylamine, tributylamine, triethylamine, tripropylamine, imidazole, citric acid or alkali metal salts thereof, acetylacetone, hypophosphorous acid or alkali metal salts thereof, histidine, alginine, ethylenediaminetetraacetic acid or alkali metal salts thereof, ethanolamine and acetonitrile. The amount of these oxygen- or nitrogen-based complexing agents is preferably 0.01-200 parts by weight, more preferably 0.1-200 parts by weight, further preferably 0.5-150 parts by weight for 1000 parts by weight of the divalent copper oxide as mentioned above.

Furthermore, in the present invention, when a complexing agent in which at least one donor atom is sulfur is used in an amount of 0.01-2 parts by weight for 1000 parts by weight of the divalent copper oxide, production of finer copper microparticles can be easily controlled. As complexing agents containing sulfur, mention may be made of, for example, the above mercaptocarboxylic acids, thioglycols, sulfur-containing amino acids, aliphatic thiols, alicyclic thiols, aromatic thiols, thioketones, thioethers, polythiols, thiocarbonic acids, sulfur-containing heterocyclic compounds, thiocyanates and isothiocyanates, inorganic sulfur compounds, thionic acids, aminothiols, thioamides, thioureas, thiazoles, or salts or derivatives thereof. Among them, mercaptocarboxylic acids, thioglycols and sulfur-containing amino acids are preferred because they are high in effect, and mercaptopropionic acid, mercaptoacetic acid, mercaptoethanol and cysteine are more preferred. More preferred amount is 0.05-1 part by weight, and further preferred is 0.05 part by weight or more and less than 0.5 part by weight.

The "protective colloid" acts as a dispersion stabilizer for the produced copper microparticles, and those which are known as protective colloids can be used. Examples thereof comprise natural polymers and synthetic polymers. As natural polymers, mention may be made of, for example, proteins such as gelatin, gum arabic, casein, sodium caseinate and ammonium caseinate, starch, dextrin, agar and sodium alginate. As synthetic polymers, mention may be made of, for example, celluloses such as hydroxyethyl cellulose, carboxymethyl cellulose, methyl cellulose and ethyl cellulose, vinyl compounds such as polyvinyl alcohol and polyvinyl pyrrolidone, acrylic acid compounds such as sodium polyacrylate and ammonium polyacrylate, and polyethylene glycol. These may be used each alone or in combination of two or more. Polymeric protective colloids have high dispersion stabilization effect and are preferred. When reaction is carried out in an aqueous liquid medium, water-soluble protective colloids are preferred, and especially preferred are gelatin, polyvinyl alcohol, polyvinyl pyrrolidone and polyethylene glycol. When they are used in an amount of 1-100 parts by weight for 100 parts by weight of the divalent copper oxide, the resulting copper microparticles are readily dispersed and stabilized, and hence the above range is preferred and 2-50 parts by weight is more preferred.

As for the "reducing agent", it is preferred to use a reducing agent having strong reducing power so that monovalent copper oxide is not produced during the reduction reaction. Examples of the reducing agent are hydrazine-based reducing agents, e.g., hydrazine and hydrazine compounds such as hydrazine hydrochloride, hydrazine sulfate and hydrazine hydrate, sodium borohydride, sodium sulfite, sodium hydrogensulfite, sodium thiosulfate, sodium nitrite, sodium hyponitrite, phosphorous acid and salts thereof such as sodium phosphite, and hypophosphorous acid and salts thereof such as sodium hypophosphite. These may be used each alone or in combination of two or more. Particularly, hydrazine reducing agents are strong in reducing power and are preferred. The amount of the reducing agent can be optionally set as long as copper microparticles can be produced from the divalent copper oxide, and is preferably in the range of 0.2-5 mols for 1 mol of copper contained in the divalent copper oxide. If the amount of the reducing agent is less than the above range, the reaction hardly proceeds and copper microparticles are not sufficiently produced, and if it is more than the above range, the reaction proceeds to excess and desired copper microparticles can hardly be obtained. The amount of the reducing agent is more preferably in the range of 0.3-2 mols.

After producing metallic copper microparticles in the presence of a complexing agent and a protective colloid by the above-mentioned process, if necessary, the microparticles are subjected to fractionation and washing, and preferably, a protective colloid scavenger is added to the liquid medium to flocculate the metallic copper microparticles, followed by subjecting to fractionation. The "protective colloid scavenger" is a compound which decomposes or dissolves the protective colloid to inhibit the action of the protective colloid, and the effect of the present invention can be obtained if it can remove the protective colloid even partially from the liquid medium even if it cannot completely remove the protective colloid. The protective colloid scavenger is optionally selected depending on the protective colloid used. Specifically, there can be used proteases such as serine proteases (e.g., trypsin and chymotrypsin), thiol proteases (e.g., papain), acid proteases (e.g., pepsin), and metal proteases for protein protective colloids, amylases such as amylase and maltase for starch protective colloids, and cellulases such as cellulase and cellobiase for cellulose protective colloids. Organic solvents such as formamide, glycerin and glycol, acids and alkalis can be used for protective colloids such as vinyl compounds, acrylic acid compounds, or polyethylene glycol. The amount of the protective colloid scavenger may be such that the protective colloid can be removed to such an extent that the copper microparticles can be flocculated and fractionated, and the amount varies depending on its kind. In the case of protease, the amount is preferably 0.001-1000 parts by weight, more preferably 0.01-200 parts by weight, further preferably 0.01-100 parts by weight for 1000 parts by weight of the protein protective colloid. The temperature of the liquid medium when the protective colloid scavenger is added can be optionally set, and it may be added in the state of keeping the reduction reaction temperature, or preferably at a temperature in the range of 10° C. to the boiling point of the liquid medium used because removal of the protective colloid smoothly proceeds and more preferably at 40-95° C. When the protective colloid scavenger is added and thereafter this state is properly kept, the protective colloid can be decomposed, and the time for which the above state is kept is suitably about 10 minutes to 10 hours. After the protective colloid is removed and the metallic microparticles are flocculated, fractionation is carried out by usual methods. The fractionation method is not particularly limited, and there may be employed the methods such as gravity filtration, pressure filtration, vacuum filtration, suction filtration, centrifugal filtration and gravity settling. Industrially, pressure filtration, vacuum filtration and suction filtration are preferred, and use of filters such as filter press and roll press is preferred because they are high in dehydrating ability and can fractionate the copper microparticles in a large amount.

As an embodiment of the above process, when a flocculating agent is further added after the protective colloid scavenger is added, the yield is further improved, which is preferred. Known flocculating agents can be used, and specifically there may be used anionic-flocculating agents (e.g., partial hydrolyzates of polyacrylamide, acrylamide sodium acrylate copolymer, and sodium alginate), cationic flocculating agents (e.g., polyacrylamide, dimethylaminoethyl methacrylate, dimethylaminoethyl acrylate, polyamidine and chitosan), amphoteric flocculating agents (e.g., acrylamide-dimethylaminoethyl acrylate acrylic acid copolymer), and the like. The amount of the flocculating agents can be optionally set as required, and is preferably 0.5-100 parts by weight, more preferably 1-50 parts by weight for 1000 parts by weight of the copper microparticles.

Alternatively, the similar yield improving effect can also be obtained by adjusting the pH of the liquid medium to 6 or lower by using an acid in place of the flocculating agent after the addition of the protective colloid scavenger. If the pH is lower than 3, the copper microparticles are corroded or dissolved, and hence a range of 3-6 is a preferred pH range, and the range of 4-6 is further preferred because the amount of the acid can be reduced.

If necessary, after the metallic copper microparticles are subjected to solid-liquid separation and washing, solid matters of the resulting metallic copper microparticles may be dispersed, for example, in an aqueous liquid medium or an organic solvent type liquid medium such as alcohol, preferably an aqueous liquid medium, and this dispersion may be used. Alternatively, the solid matters of the metallic copper microparticles may be dried by a usual method, and furthermore after the drying, they may be dispersed, for example, in an aqueous liquid medium or an organic solvent type liquid medium such as alcohol, preferably an aqueous liquid medium, and the dispersion may be used. Since the metallic copper microparticles are susceptible to oxidation, the drying is carried out preferably in an inert gas atmosphere such as nitrogen or argon. After the drying, they may be ground, if necessary.

Furthermore, the present invention relates to metallic copper microparticles, which contain at least metallic copper and has metallic property and may contain impurities, copper compounds and oxidation stabilizers on the surface or inside of the copper microparticles to such an extent as not interfering the use. The metallic copper microparticles of the present invention are fine and contain substantially no agglomerated particles and have regular shapes. Indications for these properties are that when an average particle diameter (cumulative 50% diameter) as measured by an electron microscope, namely, an average primary particle diameter is expressed by (D) and an average particle diameter (cumulative 50% diameter) as measured by a dynamic light scattering method, namely, an average secondary particle diameter is expressed by (d), the metallic copper microparticles have a (D) in the range of 0.005-2.0 μm, a (d) in the range of 0.005-2.0 μm, and a ratio d/D in the range of 0.7-2. The degree of agglomeration is low since (D) and (d) are in the above ranges and fine, and the ratio d/D is in the above range and very close to 1. Therefore, the metallic copper microparticles have excellent dispersibility in fluid composition, and such metallic copper microparticles are obtained by the above-mentioned process. The ratio d/D is usually 1 or more, but since the measuring methods of (D) and (d) are different, d/D may be smaller than 1 in some cases. The shape of the metallic copper microparticles of the present invention can be observed by an electron microscope and is regular with polyhedron structure.

The preferred ranges of the average primary particle diameter (D), the average secondary particle diameter (d) and the ratio d/D of the metallic copper microparticles of the present invention are a range of (D) of 0.005-1.0 μm, a range of (d) of 0.005-1.0 μm, and a range of d/D of 0.7-1.5, more preferred ranges are a range of (D) of 0.005-0.75 μm, a range of (d) of 0.005-0.75 μm, and a range of d/D of 0.7-1.5, further preferred ranges are a range of (D) of 0.005-0.5 μm, a range of (d) of 0.005-0.5 μm, and a range of d/D of 0.7-1.5, and further more preferred ranges are a range of (D) of 0.005-0.4 μm, a range of (d) of 0.005-0.4 μm, and a range of d/D of 0.7-1.5. Moreover, depending on the use, the lower limit of the average primary particle diameter (D) and the average secondary particle diameter (d) is more preferably 0.01 μm, further preferably 0.02 μm, and most preferably 0.05 μm. Such copper microparticles are obtained by using a complexing agent containing at least one atom selected from nitrogen and oxygen as a donor atom in the above-mentioned process.

Furthermore, copper microparticles obtained using the complexing agent containing at least sulfur as a donor atom in an amount of 0.01-2 parts by weight, preferably 0.05-1 part by weight, further preferably not less than 0.05 part by weight and less than 0.5 part by weight based on 1000 parts by weight of the copper oxide have an average primary particle diameter (D) of 0.005-0.5 μm, an average secondary particle diameter (d) of 0.005-0.5 μm, and a ratio d/D of 0.7-1.5. More preferred mode of the copper microparticles is such that (D) is in the range of not less than 0.005 μm and less than 0.1 μm, (d) is in the range of not less than 0.005 μm and less than 0.1 μm, and d/D is in the range of 0.7-1.5.

Moreover, the present invention relates to a fluid composition such as ink, paint or paste, which contains at least the metallic copper microparticles and a dispersion medium. The content of the metallic copper microparticles may be at least about 1% by weight, and is preferably a high content of not less than 5% by weight, more preferably not less than 10% by weight, and further preferably not less than 15% by weight. The dispersion medium used for dispersing the metallic copper microparticles is optionally selected according to the affinity for the copper microparticles used, and there may be used, for example, water solvent, hydrophilic organic solvents such as alcohols and ketones, and hydrophobic organic solvents such as straight chain hydrocarbons, cyclic hydrocarbons and aromatic hydrocarbons. There may be used one solvent selected from them, two or more solvents having compatibility as a mixed dispersion medium, or a mixture of water and a hydrophobic organic solvent using a hydrophilic organic solvent as a compatibilizing agent. Specific examples of the dispersion medium are methanol, ethanol, propyl alcohol, isopropyl alcohol, butanol, isobutanol, and α-terpineol as alcohols, and cyclohexanone, methylcyclohexanone, 2-butanone, methyl isobutyl ketone and acetone as ketones. Furthermore, toluene, mineral spirit and the like can be suitably used as the organic solvents. Preferred dispersion media used for ink and paint are water solvent or mixed dispersion media with hydrophilic organic solvent mainly composed of water. In this case, water may be contained in an amount of usually not less than 50% by weight, preferably not less than 80% by weight in the mixed dispersion media.

In the fluid composition of the present invention using water as a dispersion medium, since water has high surface tension, it is preferred to add an organic solvent having a relative dielectric constant of 35 or more, preferably 35-200 and a boiling point of 100° C. or higher, preferably 100-250° C. because surface defects such as wrinkles and shrinks hardly occur in the coating film upon heating and firing, and uniform and high density coating film can be obtained. Examples of the organic solvent are N-methylformamide (relative dielectric constant: 190, boiling point: 197° C.), dimethyl sulfoxide (relative dielectric constant: 45, boiling point: 189° C.), ethylene glycol (relative dielectric constant: 38, boiling point: 226° C.), 4-butyrolactone (relative dielectric constant: 39, boiling point: 204° C.), acetamide (relative dielectric constant: 65, boiling point: 222° C.), 1,3-dimethyl-2-imidazolidinone (relative dielectric constant: 38, boiling point: 226° C.), formamide (relative dielectric constant: 111, boiling point: 210° C.), N-methylacetamide (relative dielectric constant: 175, boiling point: 205° C.), and furfural (relative dielectric constant: 40, boiling point: 161° C.), and one or more of them can be used. Among them, N-methylformamide (surface tension: $38 \times 10^{-3}$ N/m), dimethyl sulfoxide (surface tension: $43 \times 10^{-3}$ N/m), ethylene glycol (surface tension: $48 \times 10^{-3}$ N/m), 4-butyrolactone (surface tension: $44 \times 10^{-3}$ N/m), acetamide (surface tension: $39 \times 10^{-3}$ N/m), 1,3-dimethyl-2-imidazolidinone (surface tension: $41 \times 10^{-3}$ N/m), etc. which have a surface tension of not more than $50 \times 10^{-3}$ N/m can give further higher effect and are preferred. These organic solvents of high relative dielectric constant and high boiling point are contained in an amount of preferably 20-100% by weight, more preferably 40-100% by weight in the dispersion medium excluding water.

The fluid composition of the present invention can also contain additives such as surface active agents, dispersants, thickeners, plasticizers and mildew proofing agents in addition to the metallic copper microparticles and the dispersion medium. The surface active agents are preferred because they have an action to further enhance the dispersion stability of the metallic copper microparticles or an action to control the rheological characteristics of the fluid composition to improve coatability of the composition. For example, there can be used known cationic surface active agents such as quaternary ammonium salts, anionic surface active agents such as carboxylic salts, sulfonic salts, sulfuric ester salts, and phosphoric ester salts, and nonionic surface active agents such as ether type, ether ester type, ester type and nitrogen-containing type, and one or more of them can be used. The amount of the surface active agent added is optionally set depending on the paint composition, and, in general, is preferably 0.01-0.5 part by weight for 1 part by weight of the metallic copper microparticles. Furthermore, if necessary, the fluid composition may contain organic hardening binders such as phenolic resin, epoxy resin, unsaturated polyester resin, vinyl ester resin, diallyl phthalate resin, oligo ester acrylate resin, xylene resin, bismaleimide triazine resin, furan resin, urea resin, polyurethane resin, melamine resin, silicone resin, and cellulosic resin as far as they do not damage the effects of the present invention. The amount of the hardening binder can be optionally set depending on the site of use, and in the case of forming electrodes or wiring patterns, the hardening binder is not added or added in an amount of suitably about 0-0.5% by weight, more suitably 0-0.1% by weight based on 1 part by weight of the metallic copper microparticles.

The fluid composition of the present invention can be prepared by mixing the metallic copper microparticles, the dispersion medium and other additives by known method, and, there may be used, for example, agitation mixing, wet grind mixing such as colloid mill, and the like, can be used. The resulting fluid composition can be used for various uses, and, for example, the composition can be coated on a substrate by screen printing, ink jet printing, or the like, followed by heating and firing to prepare circuits of printed-wiring boards and other fine conductive materials.

EXAMPLE

The present invention will be explained in more detail by the following examples, which should not be construed as limiting the invention in any manner.

1. Preparation of Copper Microparticles and Evaluation

Examples 1-16

24 g of industrial cupric oxide (N-120 manufactured by NC Tech Co., Ltd.) having an average crystallite diameter of 90.2 nm and 9.6 g of gelatin as a protective colloid were added to 300 ml of pure water and mixed, and the pH of the mixed solution was adjusted to 11 with 15% aqueous ammonia, followed by heating from room temperature to 90° C. over 20 minutes. After the heating, while stirring, thereto was added a mixed solution prepared by mixing a solution of a complexing agent (kind and amount of the complexing agent used are shown in Table 1) and 28 g of 80% hydrazine monohydrate with 150 ml of pure water, and a reaction with the cupric oxide was carried out over 1 hour to produce copper microparticles. Thereafter, the copper microparticles were subjected to filtration and washing until the specific conductivity of the filtrate reached 100 μS/cm or lower, and dried at a temperature of 60° C. over 10 hours in an atmosphere of nitrogen gas to obtain copper microparticles of the present invention. They are referred to as Samples A-α, respectively.

Example 17

24 g of the industrial cupric oxide used in Example 1 and 2.8 g of gelatin as a protective colloid were added to 150 ml of pure water and mixed, and the pH of the mixed solution was adjusted to 11 with 15% aqueous ammonia, followed by heating from room temperature to 90° C. over 20 minutes. After the heating, while stirring, thereto was added a mixed solution prepared by mixing 0.24 g of 1% 3-mercaptopropionic acid solution as a complexing agent (the amount is shown in Table 1) and 10 g of 80% hydrazine monohydrate with 150 ml of pure water, and a reaction with the cupric oxide was carried out over 1 hour to produce copper microparticles. Thereafter, the copper microparticles were subjected to filtration and washing until the specific conductivity of the filtrate reached 100 ES/cm or lower, and dried at a temperature of 60° C. over 10 hours in an atmosphere of nitrogen gas to obtain copper microparticles of the present invention (Sample Q).

Example 18

64 g of the industrial cupric oxide used in Example 1 and 5.1 g of gelatin as a protective colloid were added to 650 ml of pure water and mixed, and the pH of the mixed solution was adjusted to 10 with 15% aqueous ammonia, followed by heating from room temperature to 90° C. over 20 minutes. After heating, while stirring, thereto was added a mixed solution prepared by mixing 6.4 g of 1% mercaptoacetic acid solution as a complexing agent (the amount is shown in Table 1) and 75 g of 80% hydrazine monohydrate with 150 ml of pure water, and a reaction with the cupric oxide was carried out over 1 hour to produce copper microparticles. Thereafter, the copper microparticles were subjected to filtration and washing until the specific conductivity of the filtrate reached 100 μS/cm or lower, and dried at a temperature of 60° C. over 10 hours in an atmosphere of nitrogen gas to obtain copper microparticles of the present invention (Sample R).

Example 19

24 g of the industrial cupric oxide used in Example 1, 0.065 g of 3-mercaptopropionic acid as a complexing agent (the amount is shown in Table 1) and 3.8 g of gelatin as a protective colloid were added to 400 ml of pure water and mixed, and the pH of the mixed solution was adjusted to 4 with 10% sulfuric acid, followed by heating from room temperature to 90° C. over 20 minutes. After heating, while stirring, thereto was added 80% hydrazine monohydrate, and a reaction with the cupric oxide was carried out over 2 hours to produce copper microparticles. Thereafter, the copper microparticles were subjected to filtration and washing until the specific conductivity of the filtrate reached 100 μS/cm or lower, and dried at a temperature of 60° C. over 10 hours in an atmosphere of nitrogen gas to obtain copper microparticles of the present invention (Sample S).

TABLE 1

| | Sample | Complexing agent | Amount (part by weight for 1000 parts by weight of CuO) |
|---|---|---|---|
| Example 1 | A | Tri-n-propylamine | 18 |
| Example 2 | B | Triethylamine | 1.5 |
| Example 3 | C | Di-n-propylamine | 25 |
| Example 4 | D | Diethylamine | 18 |
| Example 5 | E | n-Propylamine | 15 |
| Example 6 | F | n-Butylamine | 18 |
| Example 7 | G | Imidazole | 17 |
| Example 8 | H | Trisodium citrate | 75 |
| Example 9 | I | Acetylacetone | 25 |
| Example 10 | J | Sodium hypophosphite | 27 |
| Example 11 | K | Histidine | 39 |
| Example 12 | L | Histidine | 97 |
| Example 13 | M | Alginine | 44 |
| Example 14 | N | Disodium ethylenediaminetetraacetate | 42 |
| Example 15 | O | Ethanolamine | 15 |
| Example 16 | P | Acetonitrile | 25 |
| Example 17 | Q | 3-Mercaptopropionic acid | 0.1 |
| Example 18 | R | Mercaptoacetic acid | 1.0 |
| Example 19 | S | 3-mercaptopropionic acid | 2.7 |

Examples 20-22

In Examples 8, 12 and 18, after the copper microparticles were produced, 5 ml of serine protease (PROTENASE K manufactured by Washington Biochemical Co., Ltd.) was added as a protective colloid scavenger, followed by keeping for 1 hour. Thereafter the filtration, washing and drying were carried out in the same manner as in Examples 8, 12 and 18 to obtain copper microparticles of the present invention, which are referred to as Samples a-c, respectively. The amount of serine protease was 100 parts by weight for 1000 parts by weight of gelatin.

Examples 23-25

In Examples 20-22, after the addition of serine protease and keeping for 1 hour, a polyamidine polymer flocculant (SC-700 manufactured by Hymo Co., Ltd.) was added, and thereafter the filtration, washing and drying were carried out in the same manner as in Examples 20-22 to obtain copper microparticles of the present invention, which are referred to as Samples d-f, respectively. The amount of the polyamidine polymer flocculant added was 30 parts by weight for 1000 parts by weight of the copper microparticles.

Examples 26-28

In Examples 20-22, after the addition of the protease and keeping for 1 hour, the pH was adjusted to 5 with sulfuric acid, and thereafter the filtration, washing and drying were carried out in the same manner as in Examples 20-22 to obtain copper microparticles of the present invention, which are referred to as Samples g-i, respectively.

Comparative Example 1

Copper microparticles (Sample T) were obtained in the same manner as in Example 1, except that the complexing agent was not used.

Comparative Example 2

Copper microparticles (Sample U) were obtained in the same manner as in Example 1, except that gelatin was not used.

Comparative Example 3

29 g of cupric hydroxide having an average crystallite diameter of 5.1 nm, an aqueous solution of tri-n-propylamine in an amount corresponding to 18 parts by weight for 1000 parts by weight of CuO as a complexing agent, and 9.6 g of gelatin as a protective colloid were added to 300 ml of pure water and mixed, and the pH of the mixed solution was adjusted to 11 with 15% aqueous ammonia, followed by heating from room temperature to 60° C. over 20 minutes. After heating, while stirring, thereto was added a solution prepared by mixing 20 g of glucose with 150 ml of pure water, and a reaction was carried out over 1 hour to obtain an intermediate product. Successively, while keeping the temperature at 60° C., 28 g of 80% hydrazine monohydrate was added to react with the intermediate product to produce copper microparticles. Thereafter, the copper microparticles were subjected to filtration and washing until the specific conductivity of the filtrate reached 100 μS/cm or lower, and dried at a temperature of 60° C. over 10 hours in an atmosphere of nitrogen gas to obtain copper microparticles (Sample V).

Evaluation 1: Measurement of Average Particle Diameter

Average primary particle diameter (D) of Samples A-V and a-i obtained in Examples 1-28 and Comparative Examples 1-4 was measured by electron microscope method, and average secondary particle diameter (d) was measured by a dynamic light scattering particle size distribution measuring apparatus (MICROTRACK UPA manufactured by Nikkiso Co., Ltd.). The average secondary particle diameter (d) was measured using an aqueous slurry prepared by sufficiently dispersing the sample in water using an ultrasonic dispersing machine and adjusting the concentration so that the signal intensity of laser reached 0.6-0.8. The results are shown in Table 2. It can be seen that the copper microparticles obtained according to the present invention were fine in average particle diameter (D), namely, primary particle diameter. Furthermore, it can be seen that they were also fine in average particle diameter (d), namely, secondary particle diameter, and simultaneously they had a d/D close to 1, and contained substantially no agglomerated particles.

TABLE 2

| | Sample | Average primary particle diameter (D) (μm) | Average secondary particle diameter (d) (μm) | d/D |
|---|---|---|---|---|
| Example 1 | A | 0.12 | 0.14 | 1.17 |
| Example 2 | B | 0.14 | 0.16 | 1.14 |
| Example 3 | C | 0.12 | 0.12 | 1.00 |
| Example 4 | D | 0.13 | 0.13 | 1.00 |
| Example 5 | E | 0.11 | 0.10 | 0.91 |
| Example 6 | F | 0.11 | 0.11 | 1.00 |
| Example 7 | G | 0.10 | 0.10 | 1.00 |
| Example 8 | H | 0.09 | 0.09 | 1.00 |
| Example 9 | I | 0.11 | 0.10 | 0.91 |
| Example 10 | J | 0.14 | 0.13 | 0.93 |
| Example 11 | K | 0.19 | 0.19 | 1.00 |
| Example 12 | L | 0.60 | 0.60 | 1.00 |
| Example 13 | M | 0.11 | 0.10 | 0.91 |
| Example 14 | N | 0.20 | 0.21 | 1.05 |
| Example 15 | O | 0.12 | 0.13 | 1.08 |
| Example 16 | P | 0.12 | 0.12 | 1.00 |
| Example 17 | Q | 0.05 | 0.04 | 0.80 |
| Example 18 | R | 0.08 | 0.07 | 0.88 |
| Example 19 | S | 0.50 | 0.60 | 1.20 |
| Example 20 | a | 0.09 | 0.09 | 1.00 |
| Example 21 | b | 0.60 | 0.63 | 1.05 |
| Example 22 | c | 0.08 | 0.08 | 1.00 |
| Example 23 | d | 0.10 | 0.09 | 0.90 |
| Example 24 | e | 0.60 | 0.61 | 1.00 |
| Example 25 | f | 0.08 | 0.08 | 1.00 |
| Example 26 | g | 0.09 | 0.10 | 1.11 |
| Example 27 | h | 0.60 | 0.58 | 0.97 |
| Example 28 | i | 0.08 | 0.09 | 1.13 |
| Comparative Example 1 | T | unmeasurable | 2.8 | — |
| Comparative Example 2 | U | unmeasurable | 4.2 | — |
| Comparative Example 3 | V | 1.4 | 3.7 | 2.6 |

Evaluation 2: Identification of Particle Shape

Photomicrographs of Samples A, B, L, M, and Q-U obtained in Examples 1, 2, 12, 13, 17, 18 and 19 and Comparative Examples 1 and 2 were taken. The results are shown in FIGS. 1-9. It can be seen that the copper microparticles obtained according to the present invention had regular particle shapes of polyhedral structure.

Evaluation 3: Confirmation of Production of Cuprous Oxide

Figure 1:
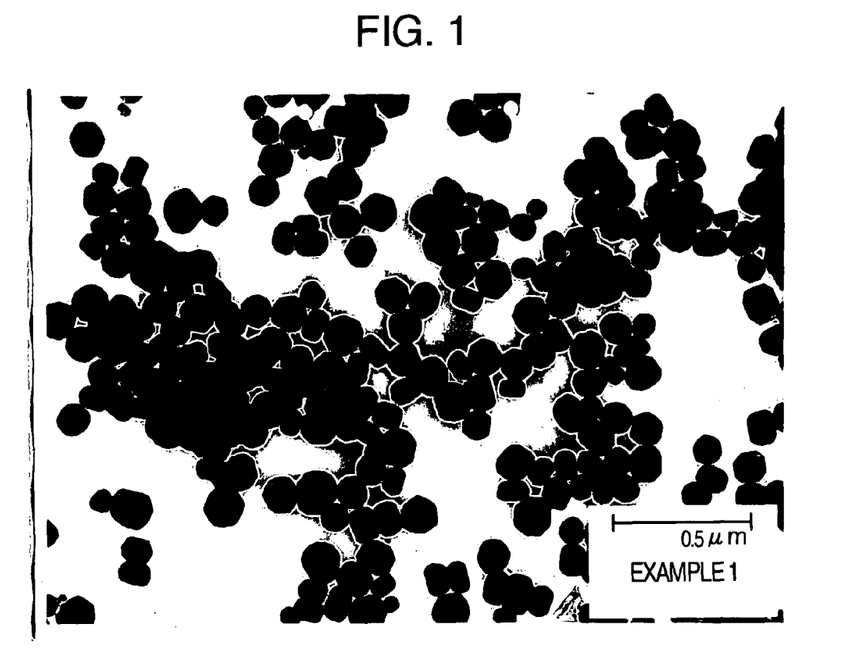
FIG. 1 is an electron photomicrograph (54000× magnification) of the copper microparticles obtained in Example 1 (Sample A).
Figure 2:
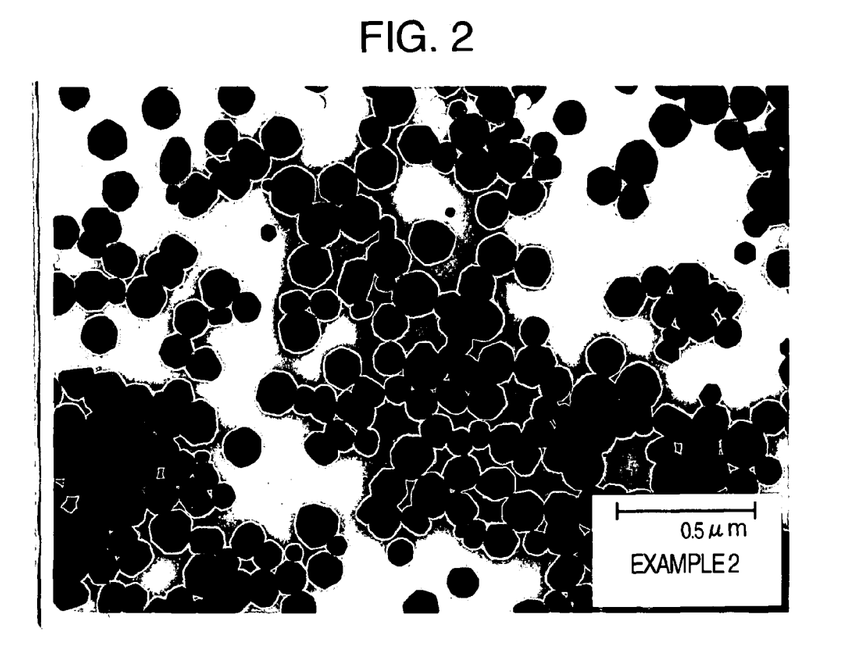
FIG. 2 is an electron photomicrograph (54000× magnification) of the copper microparticles obtained in Example 2 (Sample B).
Figure 3:
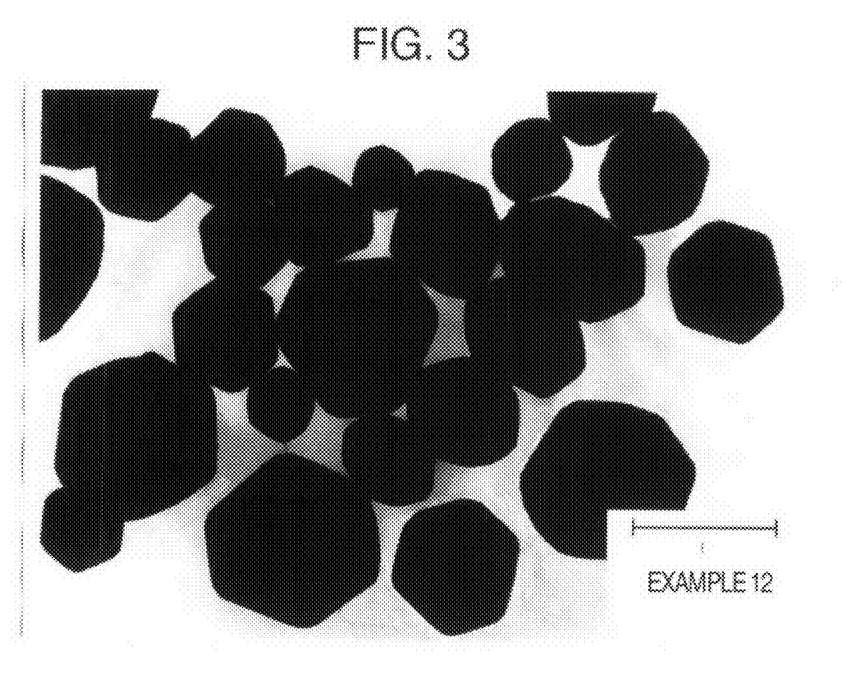
FIG. 3 is an electron photomicrograph (54000× magnification) of the copper microparticles obtained in Example 12 (Sample L).
Figure 4:
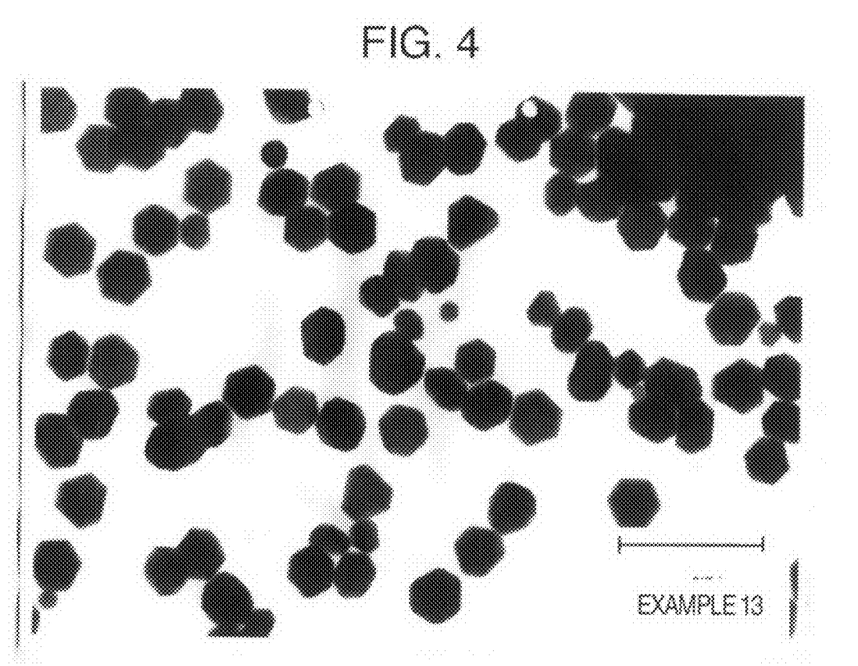
FIG. 4 is an electron photomicrograph (54000× magnification) of the copper microparticles obtained in Example 13 (Sample M).
Figure 5:
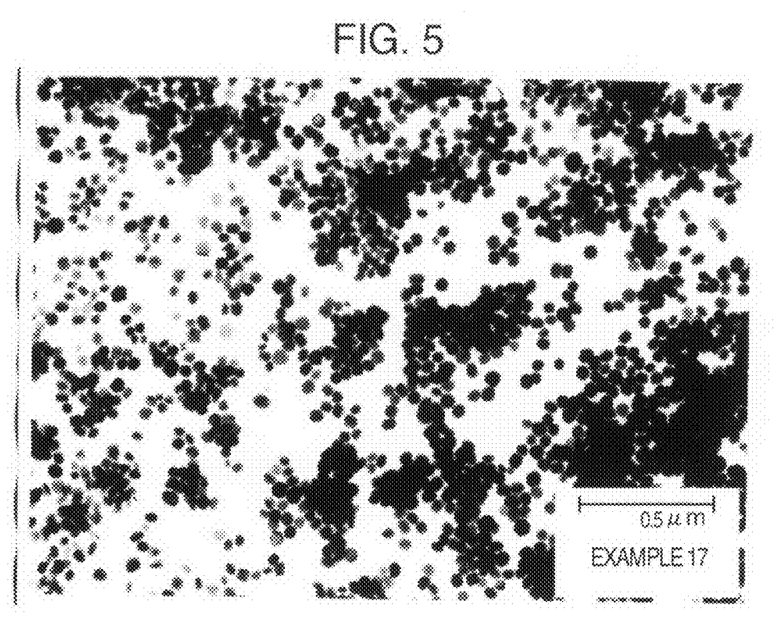
FIG. 5 is an electron photomicrograph (54000× magnification) of the copper microparticles obtained in Example 17 (Sample Q).
Figure 6:
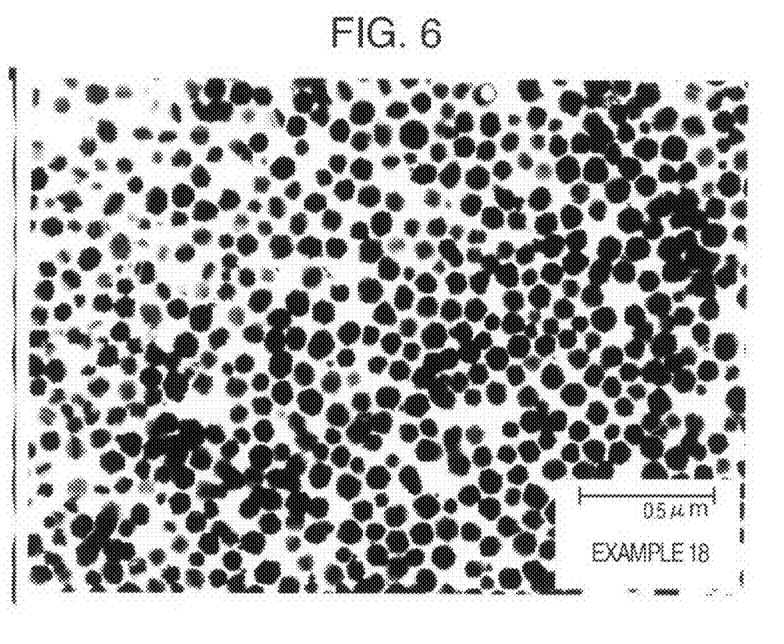
FIG. 6 is an electron photomicrograph (54000× magnification) of the copper microparticles obtained in Example 18 (Sample R).
Figure 7:
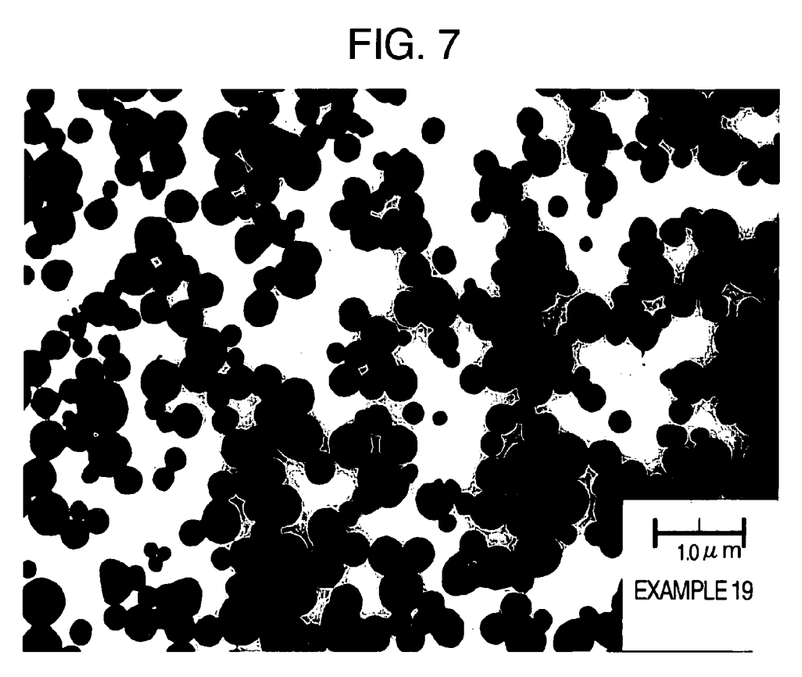
FIG. 7 is an electron photomicrograph (54000× magnification) of the copper microparticles obtained in Example 19 (Sample S).
Figure 8:
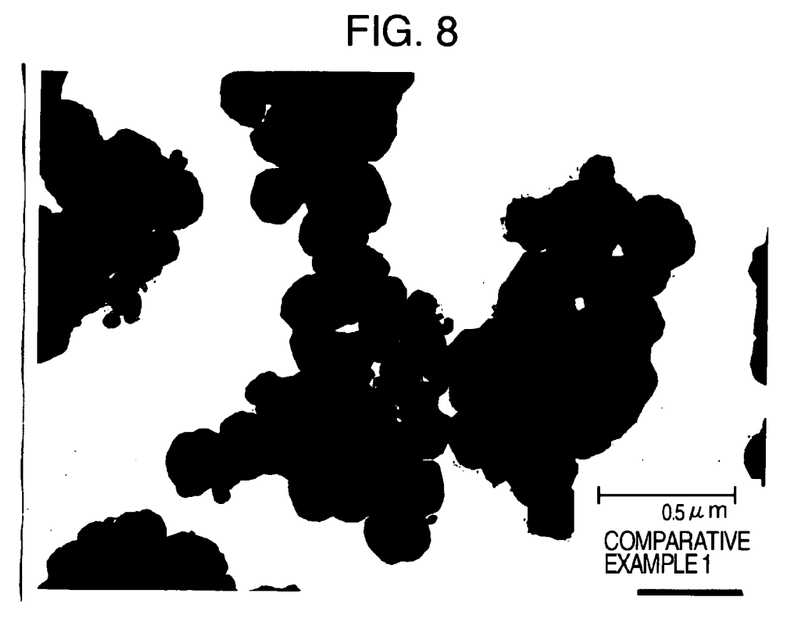
FIG. 8 is an electron photomicrograph (54000× magnification) of the copper microparticles obtained in Comparative Example 1 (Sample T).
Figure 9:
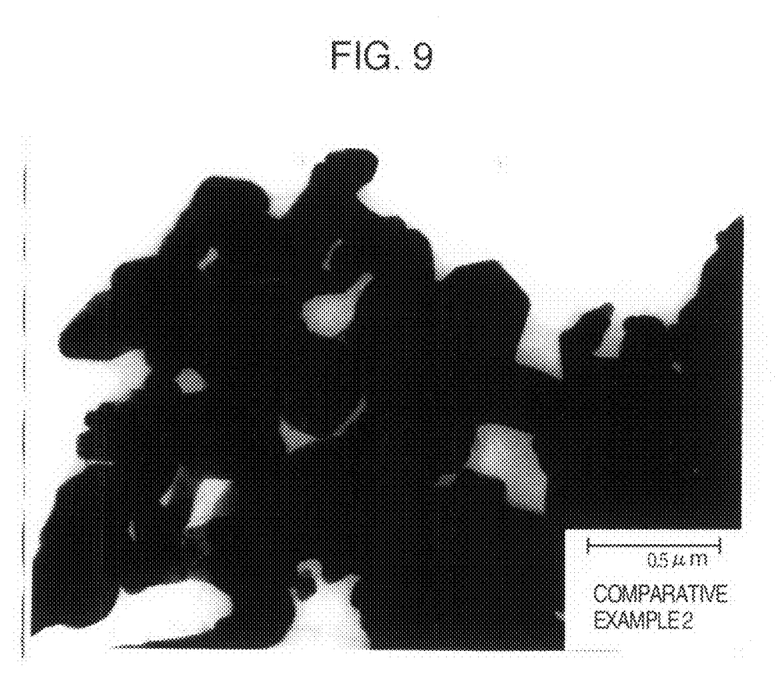
FIG. 9 is an electron photomicrograph (54000× magnification) of the copper microparticles obtained in Comparative Example 2 (Sample U).
Figure 10:
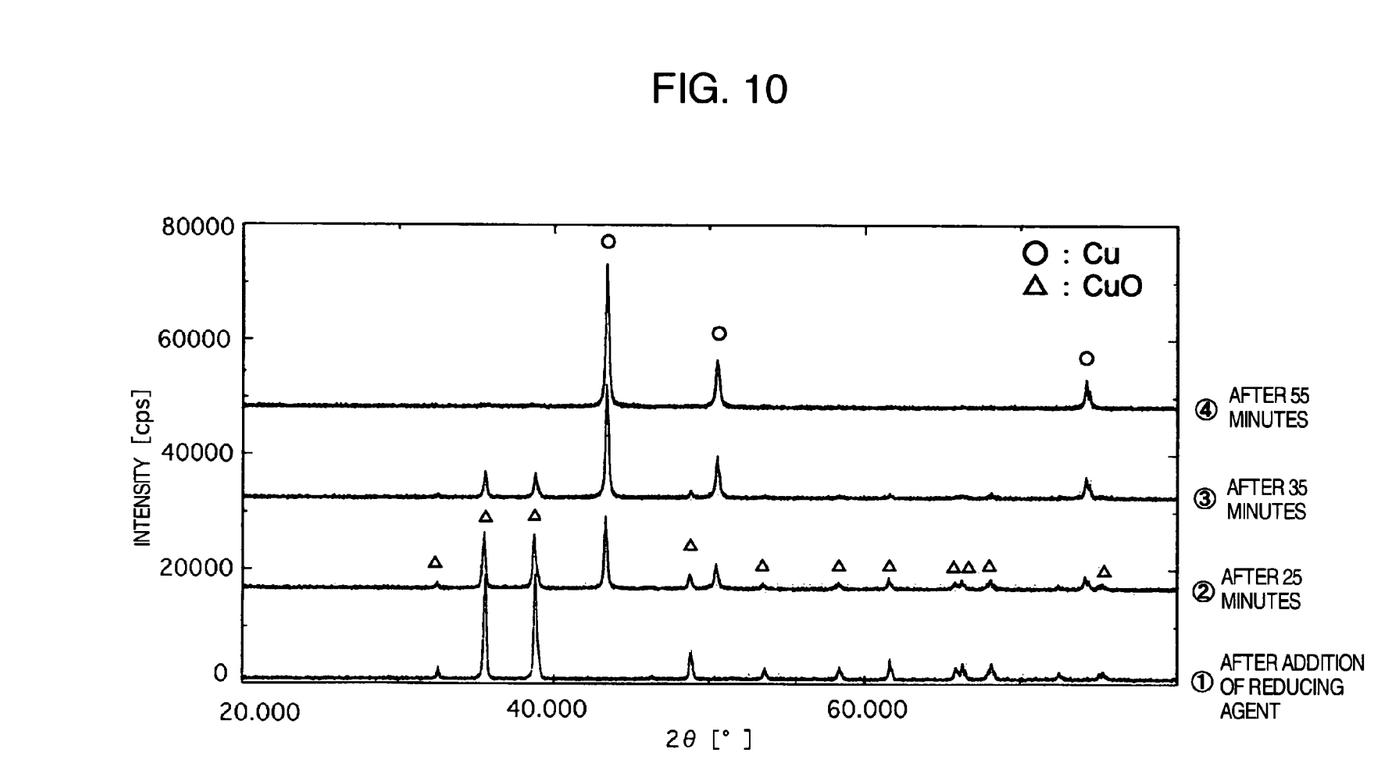
FIG. 10 shows X-ray diffraction charts of Samples j-l and N-120.
Figure 11:
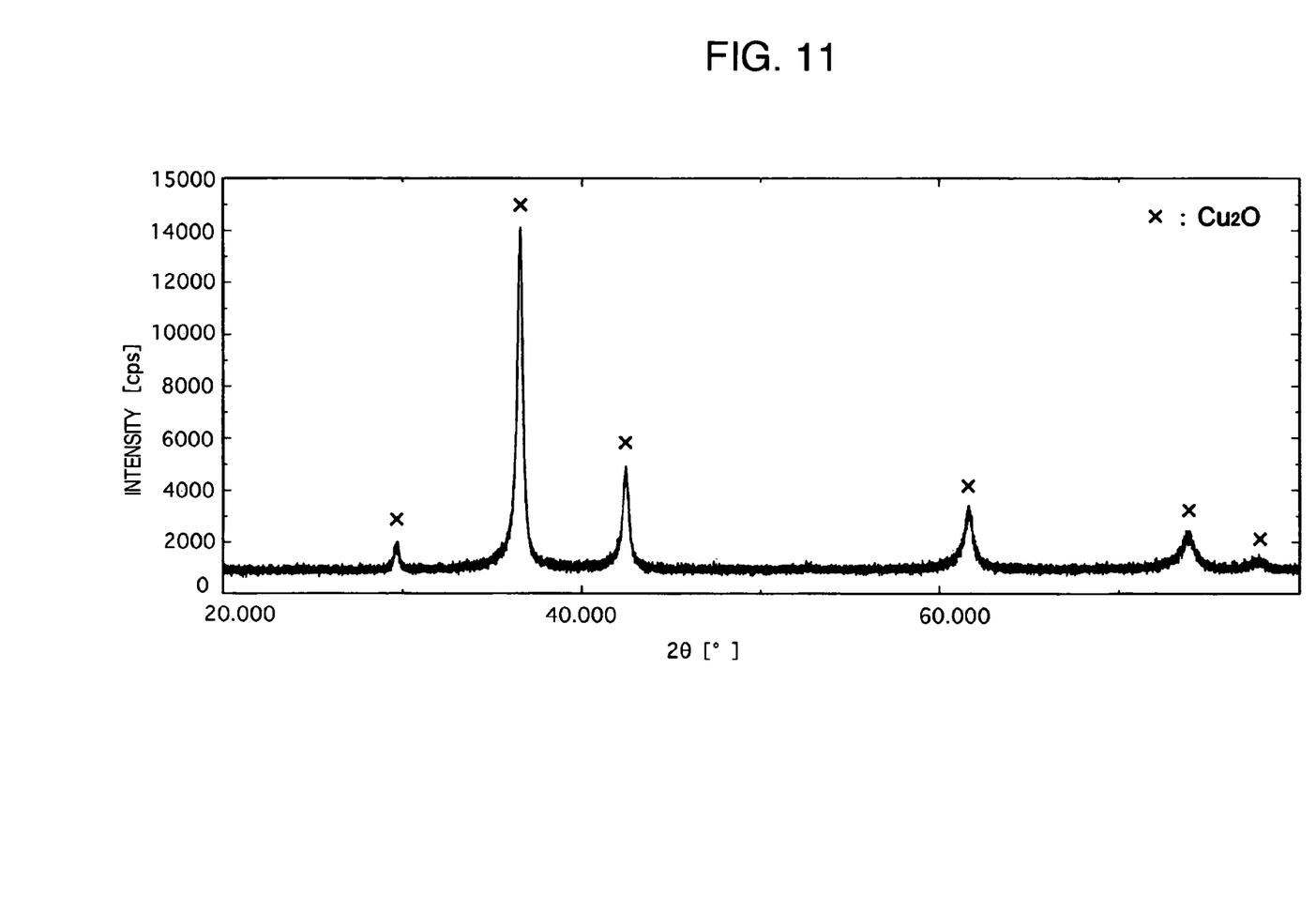
FIG. 11 shows an X-ray diffraction chart of Sample m.

In Example 14, the liquid medium in the course of reduction reaction after lapse of 25 minutes, 35 minutes and 55 minutes from addition of the reducing agent was dispensed and evaporated to dryness. These are referred to as Samples j-l. X-ray diffraction of Samples j-l and cupric oxide (N-120) used as a starting material was measured, and the results were compared. The results are shown in FIG. 10. Peaks originating from cuprous oxide were not recognized in Samples j-l, and it can be seen that cupric oxide was reduced to metallic copper without production of cuprous oxide. The same evaluation was conducted on the samples of other examples to find that cuprous oxide was not produced during the reduction reaction. Furthermore, the liquid medium containing the intermediate product obtained in Comparative Example 3 was filtered and dried, and X-ray diffraction of the dried product (Sample m) was measured. The results are shown in FIG. 11. It can be seen that the intermediate product was cuprous oxide.

Evaluation 4: Evaluation of Yield and Washability

In Examples 20-28 and Comparative Example 3, the liquid containing copper microparticles produced was subjected to solid-liquid separation by suction filtration using Buchner funnel while washing with pure water during filtration, and washing time required for the specific conductivity of the filtrate reaching 100 ES/cm or lower was measured. Furthermore, weight of the recovered copper microparticles was measured, and yield ((amount of recovered copper microparticles/amount of copper compound used in terms of metallic copper)×100) was calculated. The results are shown in Table 3. It can be seen that filtration washability and yield were improved by using the protective colloid scavenger or the protective colloid scavenger and the flocculating agent or the pH adjustor in combination.

TABLE 3

| | | Washing time (min) | Yield (%) |
|---|---|---|---|
| Example 20 | Protease | 228 | 79 |
| Example 21 | Protease | 221 | 81 |
| Example 22 | Protease | 192 | 77 |
| Example 23 | Protease + flocculating agent | 207 | 99 |
| Example 24 | Protease + flocculating agent | 183 | 99 |
| Example 25 | Protease + flocculating agent | 152 | 99 |
| Example 26 | Protease + pH adjustor | 203 | 99 |
| Example 27 | Protease + pH adjustor | 177 | 99 |
| Example 28 | Protease + pH adjustor | 167 | 99 |
| Comparative Example 3 | — | 880 | 49 |

2. Preparation and Evaluation of Copper Paste

Example 29 and Comparative Examples 4 and 5

Copper microparticles (Samples K, T and V) obtained in Example 11 and Comparative Examples 1 and 3 having the formulation as shown in Table 4 were kneaded using a three-roll kneader (roll diameter: 65 mm φ) by passing three times (roll clearance: 30 μm at the first passing, and 1 μm at the second and third passing) to obtain the copper paste of the present invention and the comparative copper pastes. These are referred to as Samples n-p, respectively.

TABLE 4

| Copper microparticles | 60 g |
|---|---|
| α-Terpineol | 20 g |
| Ethyl cellulose | 10 g |
| Mineral spirit | 10 g |

Evaluation 5: Evaluation of Dispersibility

Dispersibility of the copper pastes of Example 29 and Comparative Examples 4 and 5 (Samples n-p) was measured by the method in accordance with JIS K5400 using a grind gauge. The results are shown in Table 5. Since the smaller measurement value indicates better dispersibility, it can be seen that the copper microparticles of the present invention were superior in dispersibility when they were made into a copper paste.

Evaluation 6: Evaluation of Conductivity

Each of the copper pastes of Example 29 and Comparative Examples 4 and 5 (Samples n-p) was coated on an aluminum plate using a 4 mil applicator and predried at a temperature of 80° C. for 2 hours, followed by baking at 300° C. for 1 hour in a nitrogen atmosphere (nitrogen flow rate: 500 cc/min) to form a film and furthermore firing and reducing at 500° C. for 1 hour in a hydrogen atmosphere of 2% in concentration. The resulting film was air-cooled, and then the volume resistivity of the film was measured using LORESTA GP low resistivity meter (manufactured by Mitsubishi Chemical Corporation). The results are shown in Table 5. Since the lower volume resistivity indicates the higher conductivity, it can be seen that the copper paste containing the copper microparticles of the present invention was high in conductivity.

TABLE 5

|  | Sample | Values measured by grind gauge (μm) | Volume resistivity (Ωcm) |
| --- | --- | --- | --- |
| Example 28 | n | 1 or less | $3.9 \times 10^{-6}$ |
| Comparative Example 4 | o | 25 or more | $3.9 \times 10^{-4}$ |
| Comparative Example 5 | p | 18 | $1.2 \times 10^{-4}$ |

INDUSTRIAL APPLICABILITY

The copper microparticles of the present invention are useful as electrode materials of electronic equipments, and particularly a fluid composition such as copper paste, paint or ink containing the copper microparticles is useful for inner electrodes of laminated ceramics capacitors, circuits of printed-wiring boards, and other electrodes.

The invention claimed is:

1. A process for producing copper microparticles which comprises mixing a divalent copper oxide with a reducing agent in a liquid medium in the presence of a complexing agent and a protective colloid to produce metallic copper microparticles, wherein the complexing agent is present in an amount of 0.01-200 parts by weight for 1000 parts by weight of the divalent copper oxide.

2. A process for producing copper microparticles according to claim 1 which comprises mixing a divalent copper oxide with a reducing agent in a liquid medium to produce metallic copper microparticles without producing a monovalent copper oxide from the divalent copper oxide.

3. A process for producing copper microparticles according to claim 1, wherein a donor atom of ligand in the complexing agent is at least one atom selected from nitrogen and oxygen.

4. A process for producing copper microparticles according to claim 3, wherein the complexing agent is at least one compound selected from the group consisting of amines, nitrogen-containing heterocyclic compounds, nitriles and cyano compounds, carboxylic acids, ketones, phosphoric acids and phosphoric acid-based compounds, amino acids, aminopolycarboxylic acids and alkanolamines, and salts or derivatives thereof.

5. A process for producing copper microparticles according to claim 4, wherein the complexing agent is at least one compound selected from the group consisting of butylamine, ethylamine, propylamine, dibutylamine, diethylamine, dipropylamine, tributylamine, triethylamine, tripropylamine, imidazole, citric acid or alkali metal salts thereof, acetylacetone, hypophosphorous acid or alkali metal salts thereof, histidine, alginine, ethylenediaminetetraacetic acid or alkali metal salts thereof, ethanolamine, and acetonitrile.

6. A process for producing copper microparticles according to claim 1, wherein at least one donor atom of ligand in the complexing agent is sulfur, and the complexing agent is used in an amount of 0.01-2 parts by weight for 1000 parts by weight of the divalent copper oxide.

7. A process for producing copper microparticles according to claim 6, wherein the complexing agent is at least one compound selected from the group consisting of mercaptocarboxylic acids, thioglycols and sulfur-containing amino acids, and salts or derivatives thereof.

8. A process for producing copper microparticles according to claim 7, wherein the complexing agent is at least one compound selected from the group consisting of mercaptopropionic acid, mercaptoacetic acid, mercaptoethanol and cysteine.

9. A process for producing copper microparticles according to claim 1, wherein the reducing agent is a hydrazine-based reducing agent.

10. A process for producing copper microparticles according to claim 1, wherein the divalent copper oxide has an average crystallite diameter of 20-500 nm.

11. A process for producing copper microparticles according to claim 1 wherein after producing the metallic copper microparticles, a protective colloid scavenger is added to the liquid medium to flocculate the metallic copper microparticles, and then the metallic copper microparticles are fractionated.

12. A process for producing copper microparticles according to claim 11, wherein a protein protective agent is used as the protective colloid, and a protease is used as the protective colloid scavenger.

* * * * *